US012732088B2

(12) United States Patent
Shintani

(10) Patent No.: US 12,732,088 B2
(45) Date of Patent: Sep. 8, 2026

(54) POWER CONVERSION APPARATUS

(71) Applicant: FUJI ELECTRIC CO., LTD., Kawasaki (JP)

(72) Inventor: Takanori Shintani, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 209 days.

(21) Appl. No.: 18/782,031

(22) Filed: Jul. 24, 2024

(65) Prior Publication Data

US 2025/0096668 A1 Mar. 20, 2025

(30) Foreign Application Priority Data

Sep. 20, 2023 (JP) ................................ 2023-152295

(51) Int. Cl.

| | |
|---|---|
| ***H02M 1/00*** | (2006.01) |
| ***H02M 1/32*** | (2007.01) |
| ***H02M 7/00*** | (2006.01) |
| ***H05K 5/03*** | (2006.01) |
| ***H05K 7/20*** | (2006.01) |

(52) U.S. Cl.

CPC ........... *H02M 1/007* (2021.05); *H02M 1/327* (2021.05); *H02M 7/003* (2013.01); *H05K 5/03* (2013.01); *H05K 7/20927* (2013.01); *H02M 1/008* (2021.05)

(58) Field of Classification Search

CPC ...... H02M 1/007; H02M 1/327; H02M 7/003; H02M 1/008; H02M 3/158; H02M 7/493; H02M 7/53871; H05K 5/03; H05K 7/20927; H05K 7/20254

See application file for complete search history.

(56) References Cited

U.S. PATENT DOCUMENTS

| | | | | |
|---|---|---|---|---|
| 9,247,675 | B2 * | 1/2016 | Higuchi | B60L 15/20 |
| 10,420,256 | B1 * | 9/2019 | Nakamura | H05K 7/20927 |
| 11,297,743 | B2 * | 4/2022 | Douillard | H05K 7/20927 |
| 2020/0214180 | A1 * | 7/2020 | Kobayashi | H05K 7/20927 |
| 2020/0335424 | A1 * | 10/2020 | Fukakusa | H10W 40/47 |
| 2023/0104002 | A1 | 4/2023 | Azuma et al. | |

FOREIGN PATENT DOCUMENTS

| | | |
|---|---|---|
| JP | 2023-053944 A | 4/2023 |

* cited by examiner

*Primary Examiner* — Kyle J Moody

(74) *Attorney, Agent, or Firm* — HAUPTMAN HAM, LLP

(57) ABSTRACT

A power conversion apparatus includes a lid including a boost-converter lid arranged to include a placement area for a boost converter, and a direct-current/direct-current-converter lid arranged on a direct current/direct current converter side with respect to the boost-converter lid to include a placement area for a direct current/direct current converter, to exclude the placement area for the boost converter, and to overlap the boost-converter lid.

6 Claims, 6 Drawing Sheets

300
300a
300b
10
10a
10b
11
11a
11b
M
M
102
Q1
Q2
Q3
Q4
Q5
Q6
R
C1
C2
Q11
Q12
21
23
A
22
20
100
DCDC
30
103
201
201
101
200

POWER CONVERSION APPARATUS

CROSS-REFERENCE TO RELATED APPLICATION

The present application is based on, and claims priority from Japanese Patent Application No. 2023-152295 filed on Sep. 20, 2023, the disclosure of which is hereby incorporated by reference herein in its entirety.

BACKGROUND

Technical Field

The present disclosure relates to a power conversion apparatus.

Description of the Background Art

Power conversion apparatuses including a base in which a cooling flow path is formed are known in the art. Such a power conversion apparatus is disclosed in Japanese Patent Laid-Open Publication No. JP 2023-53944, for example.

Japanese Patent Laid-Open Publication No. JP 2023-53944 discloses a power conversion apparatus including a base including a cooler main part in which a cooling flow path is formed, and a lid that is arranged to cover the cooling flow path of the cooler main part. The power conversion apparatus disclosed in Japanese Patent Laid-Open Publication No. JP 2023-53944 includes a boost converter and a direct current/direct current or DC/DC converter arranged on the base. In the power conversion apparatus disclosed in Japanese Patent Laid-Open Publication No. JP 2023-53944, the lid includes a placement area for the boost converter, and a placement area for the direct current/direct current converter. The direct current/direct current converter includes semiconductor switching elements.

Although not stated in Japanese Patent Laid-Open Publication No. JP 2023-53944, the semiconductor switching elements of the direct current/direct current converter are directly bonded onto the lid by an adhesive in the known power conversion apparatuses as disclosed in the above Patent Document 1 in some cases. In such a case, when the semiconductor switching elements are replaced, it is necessary to integrally remove the direct current/direct current converter including the semiconductor switching elements together with the lid from the cooler main part. Also, because not only the direct current/direct current converter but also the boost converter are arranged on the lid, it is necessary to remove the boost converter from the lid before integrally removing the direct current/direct current converter together with the lid from the cooler main part. Because the direct current/direct current converter includes relatively many components, not only in a case in which the semiconductor switching elements of the direct current/direct current converter attached to the lid are bonded onto the lid by an adhesive, the direct current/direct current converter is required to be removed together with the lid the cooling main part in some cases. For this reason, a power conversion apparatus capable of allowing integral removal of the direct current/direct current converter and the lid from the cooler main part without removal of the boost converter from the lid is desired.

SUMMARY

The present disclosure is intended to solve the above problem, and one object of one or more embodiments of the present invention is to provide a power conversion apparatus capable of allowing integral removal of a direct current/direct current converter and a lid from a cooler main part without removal of a boost converter from the lid.

In order to attain the aforementioned object, a power conversion apparatus according to one aspect of the present invention includes a boost converter for boosting direct current power input from a direct current power supply; an inverter for converting the direct current power boosted by the boost converter into alternate current power and supplying the alternate current power to a load; a direct current/direct current converter for transforming the direct current power input from the direct current power supply; and a base on which the boost converter, the inverter, and the direct current/direct current converter are arranged, wherein the base includes a cooler main part including a cooling flow path formed in the cooler main part, and formed of a metal, and a lid arranged to cover the cooling flow path of the cooler main part, and formed of a metal, and the lid includes a boost-converter lid arranged to include a placement area for the boost converter, and a direct-current/direct-current-converter lid arranged on the direct current/direct current converter side with respect to the boost-converter lid to include a placement area for the direct current/direct current converter, to exclude the placement area for the boost converter, and to overlap the boost-converter lid.

In the power conversion apparatus according to the aforementioned one aspect of this invention, as discussed above, the lid includes a boost-converter lid arranged to include a placement area for the boost converter, and a direct-current/direct-current-converter lid arranged on the direct current/direct current converter side with respect to the boost-converter lid to include a placement area for the direct current/direct current converter, to exclude the placement area for the boost converter, and to overlap the boost-converter lid. According to this configuration, because the direct-current/direct-current-converter lid, which includes the placement area for the direct current/direct current converter and does not include the placement area for the boost converter, is arranged on the direct current/direct current converter side with respect to the boost-converter lid, it is possible to integrally remove, from the cooler main part, the direct current/direct current converter and the direct-current/direct-current-converter lid on which direct current/direct current converter is arranged with the boost converter being arranged on the boost-converter lid. Consequently, integral removal of the direct current/direct current converter and the lid from the cooler main part is allowed without removal of the boost converter from the lid.

In the power conversion apparatus according to the aforementioned aspect, it is preferable that the boost-converter lid includes a through opening formed at a position corresponding to the direct-current/direct-current-converter lid; and that the direct-current/direct-current-converter lid is arranged on the direct current/direct current converter side with respect to the boost-converter lid to close the through opening by the direct-current/direct-current-converter lid. According to this configuration, because a thickness of the lid in a part that closes the through opening by using the direct-current/direct-current-converter lid is defined by only a thickness of the direct-current/direct-current-converter lid, even in a configuration in which the direct-current/direct-current-converter lid overlaps with the boost-converter lid, it is possible to suppress increase of a part of the lid whose thickness is defined by thicknesses of the two lids, which are the direct-current/direct-current-converter lid and the boost-converter lid. Consequently, it is possible to prevent reduction of heat dissipation from the lid due to the overlapping of the direct-current/direct-current-converter lid with the boost-converter lid.

In the configuration in which the direct-current/direct-current-converter lid is arranged on the direct current/direct current converter side with respect to the boost-converter lid to close the through opening by the direct-current/direct-current-converter lid, it is preferable that the power conversion apparatus further comprising a cooling fin formed on a surface of the direct-current/direct-current-converter lid on the cooling flow path side to pass the through opening of the boost-converter lid so as to protrude into the cooling flow path. According to this configuration, it is possible to efficiently cool the direct-current/direct-current-converter lid by a cooling liquid flowing in the cooling flow path through the cooling fin. Consequently, it is possible to efficiently dissipate heat generated from the direct-current/direct-current-converter lid to the cooling flow path covered by the direct-current/direct-current-converter lid.

In the configuration in which the cooling fin is formed on the surface of the direct-current/direct-current-converter lid on the cooling flow path side, it is preferable that the cooling fin protruding into the cooling flow path through the through opening has a curved shape extending in a flow direction of a cooling liquid in the cooling flow path. According to this configuration, because a surface area of the cooling fin is increased by a curved amount of the cooling fin, it is possible to more efficiently cool the direct-current/direct-current-converter lid by the cooling liquid flowing in the cooling flow path through the cooling fin.

In the configuration in which the direct-current/direct-current-converter lid is arranged on the direct current/direct current converter side with respect to the boost-converter lid to close the through opening by the direct-current/direct-current-converter lid, it is preferable that the power conversion apparatus further comprising: a seal groove formed around the through opening on a surface of the direct-current/direct-current-converter lid side of the boost-converter lid; and a seal arranged in the seal groove to seal between the boost-converter lid and the direct-current/direct-current-converter lid. According to this configuration, even in the configuration in which the direct-current/direct-current-converter lid is arranged on the direct-current/direct-current-converter lid side with respect to the boost-converter lid to close the through opening by the direct-current/direct-current-converter lid, it is possible to easily seal between the boost-converter lid and the direct-current/direct-current-converter lid by using the seal.

In the power conversion apparatus according to the aforementioned one aspect, it is preferable that the direct current/direct current converter includes a semiconductor switching element bonded onto the direct-current/direct-current-converter lid. Here, when the semiconductor switching element is replaced, it is necessary to integrally remove the direct current/direct current converter including the semiconductor switching element together with the direct-current/direct-current-converter lid to which the semiconductor switching element is bonded from the cooler main part. For this reason, in a case in which the direct current/direct current converter is configured to include the semiconductor switching element bonded onto the direct-current/direct-current-converter lid, a configuration that allows integral removal of the direct current/direct current converter and the lid from the cooler main part without removal of the boost converter from the lid is effective.

The foregoing and other objects, features, aspects and advantages of the present invention will become more apparent from the following detailed description of the present disclosure when taken in conjunction with the accompanying drawings.

DESCRIPTION OF THE DISCLOSED EMBODIMENT

Embodiments embodying the present invention will be described with reference to the drawings.

A configuration of a power conversion apparatus 100 according to one embodiment of the present invention will be described with reference to FIGS. 1 to 11. The power conversion apparatus 100, for example, is installed on a vehicle.

(Circuit Configuration of Power Conversion Apparatus)

Figure 1:
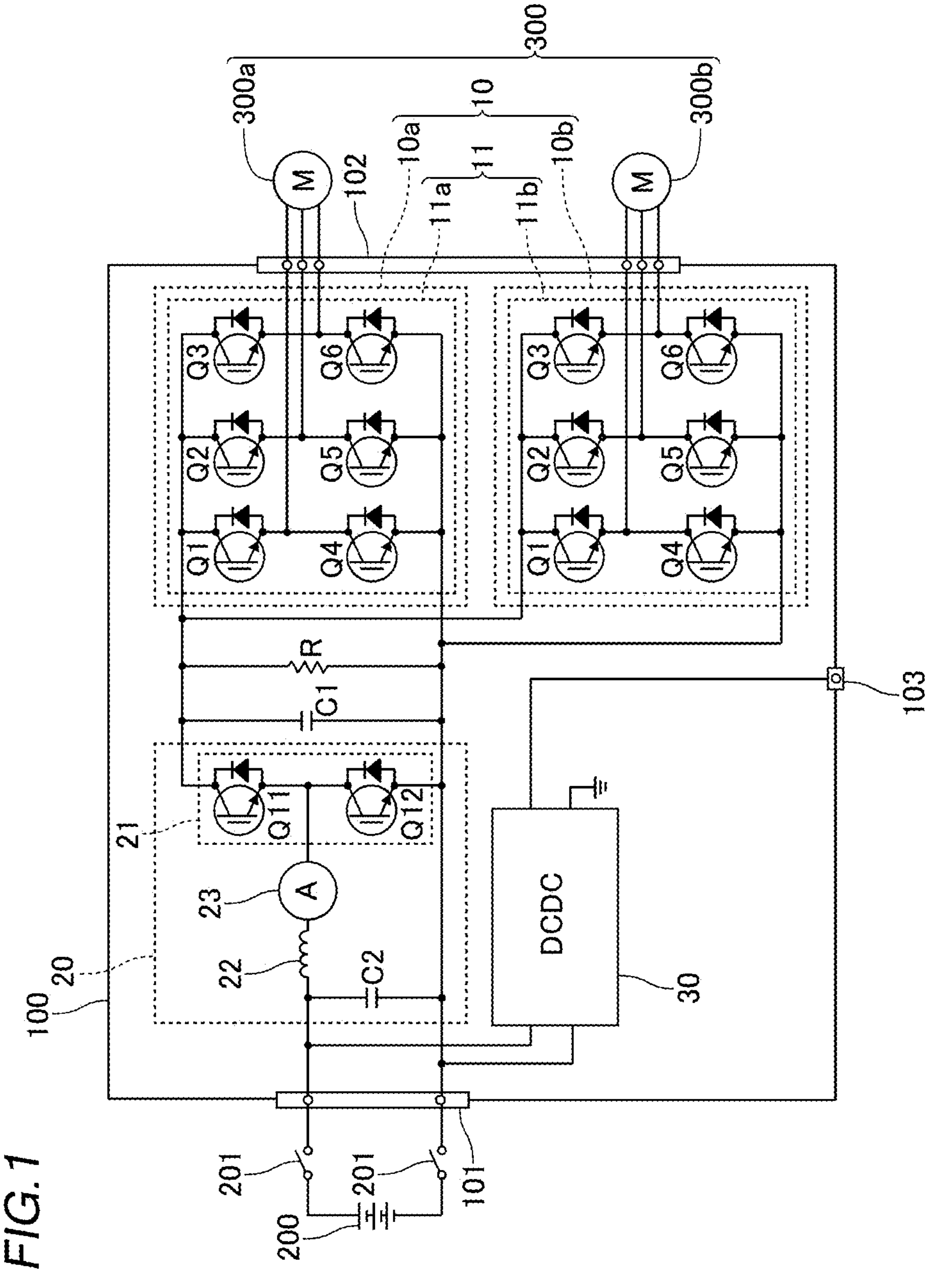
FIG. 1 is a circuit diagram of a power conversion apparatus according to one embodiment of the present invention.

As shown in FIG. 1, the power conversion apparatus 100 converts direct current power input from a direct current power supply 200 through a connector 101, and supplies the power converted to a load 300 through a connector 102. Switches 201 are connected between the power conversion apparatus 100 and the direct current power supply 200.

The power conversion apparatus 100 includes an inverter 10, a boost converter 20, a capacitor C1, a resistor R, and a direct current/direct current converter 30.

The inverter 10 converts direct current power input from the direct current power supply 200 into alternate current power, and supplies the alternate current power to the load 300.

The inverter 10 includes switching element modules 11. The switching element modules 11 convert direct current power into alternating current power. Each switching element module 11 includes semiconductor switching elements Q1, Q2 and Q3 that construct an upper arm, and semiconductor switching elements Q4, Q5 and Q6 that construct a lower arm.

The inverter 10 includes a first inverter 10*a* and a second inverter 10*b*. Switching element modules 11 include a first switching element module 11*a* included in the first inverter 10*a*, and a second switching element module 11*b* included in the second inverter 10*b*. Also, the loads 300 include a first load 300*a* and a second load 300*b*. The first inverter 10*a* converts the direct current power input from the direct current power supply 200 into alternate current power, and supplies the alternate current power to the first load 300*a* through the connector 102. The second inverter 10*b* converts the direct current power input from the direct current power supply 200 into alternate current power, and supplies the alternate current power to the second load 300*b* through the connector 102.

The boost converter 20 is arranged on an input side of the inverter 10. The boost converter 20 increases a voltage of the direct current power input from the direct current power supply 200 through the connector 101. The boost converter 20 supplies the voltage increased to the inverter 10. In other words, the inverter 10 converts the direct current power boosted by the boost converter 20 into alternate current power, and supplies the alternate current converted to the load 300.

The boost converter 20 includes a boost switching element module 21, and a reactor 22. The boost switching element module 21 includes boost switching elements Q11 and Q12. The boost switching elements Q11 and Q12 construct the upper and lower arms, respectively. In addition, the boost converter 20 includes a capacitor C2. The reactor 22 is connected between a positive side of the direct current power supply 200, and a connection point between the boost switching element Q11 and the boost switching element Q12. The capacitor C2 is connected in parallel to the boost switching element Q12.

The boost converter 20 includes a current sensor 23. The current sensor 23 measures a current that flows through the boost converter 20. The current sensor 23 is connected between the boost switching element module 21 and the reactor 22.

The capacitor C1 and the resistor R are connected between the boost converter 20 and the inverter 10. The capacitor C1 and the resistor R are connected in parallel to each other.

The direct current/direct current converter 30 transforms a direct current voltage input from the direct current power supply 200. The direct current/direct current converter 30 supplies the voltage transformed to an output terminal 103.

(Structure of Power Conversion Apparatus)

Figure 2:
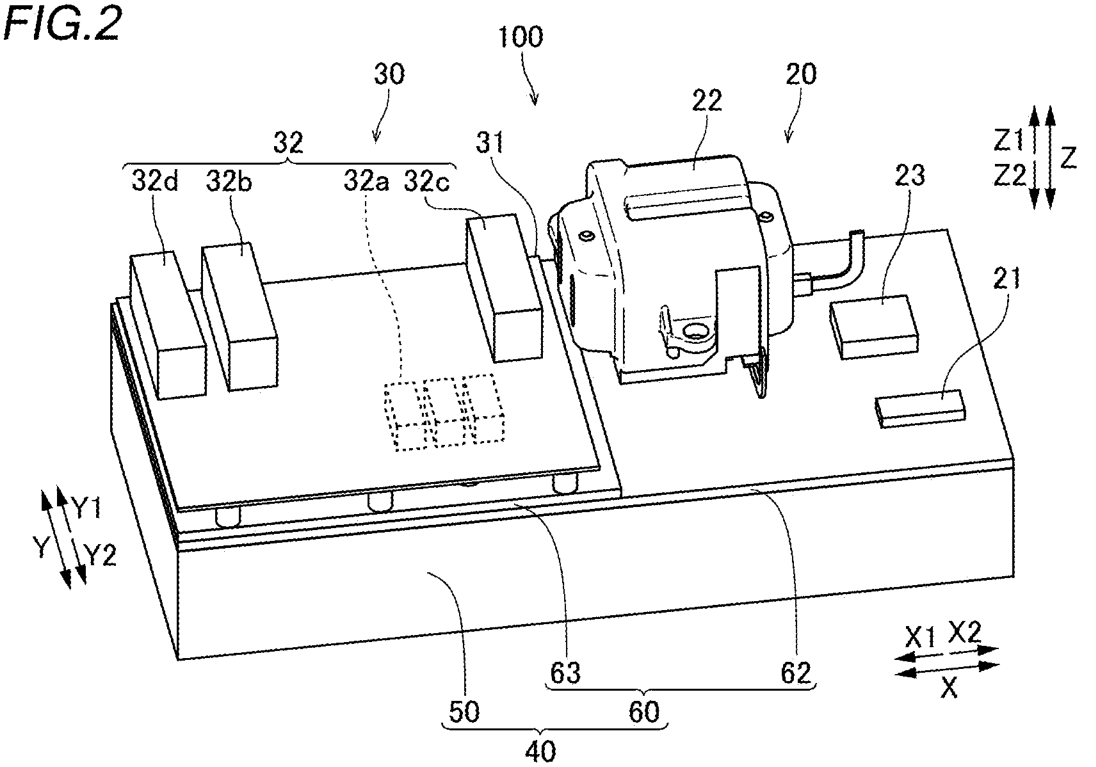
FIG. 2 is a perspective view showing the power conversion apparatus according to the one embodiment of the present invention.

As shown in FIG. 2, the power conversion apparatus 100 includes a base 40 on which the boost converter 20, the inverter 10, and the direct current/direct current converter 30 are arranged. The boost converter 20 and the direct current/direct current converter 30 are arranged on a front surface side (Z1 side) of the base 40. The inverter 10 is arranged on a back surface side (Z2 side) of the base 40.

The base 40 includes a cooler main part 50 including a cooling flow path 51 formed in the cooler main part and formed of a metal, and a lid 60 arranged to cover the cooling flow path 51 of the cooler main part 50, and formed of a metal. The cooling flow path 51 is space inside the base 40 formed by the cooler main part 50 and the lid 60, which is arranged to cover an opening (not shown) formed in the cooler main part 50. A cooling liquid such as water or antifreeze flows through the cooling flow path 51. The cooler main part 50 and the lid 60 are formed of a metal having a relatively high thermal conductivity, such as aluminum. The boost converter 20, the inverter 10, and the direct current/direct current converter 30, which are arranged on the base 40, are cooled by the cooling liquid flowing through the cooling flow path 51.

The cooling liquid that flows out of the cooling flow path 51 is cooled by dissipating its heat by using a heat dissipator 53. The cooling liquid that is cooled by the heat dissipator 53 is fed by a pump 54, and flows back into the cooling flow path 51. The heat dissipator 53 includes a heat exchanger to be cooled by outside air. The heat dissipator 53 is a radiator, for example. Alternatively, the pump 54 can be connected between the outlet of the cooling flow path 51 and the heat dissipator 53 so that the cooling liquid before the heat dissipation by the heat dissipator 53 is fed by the pump 54.

<Configuration of Lid>

Figure 3:
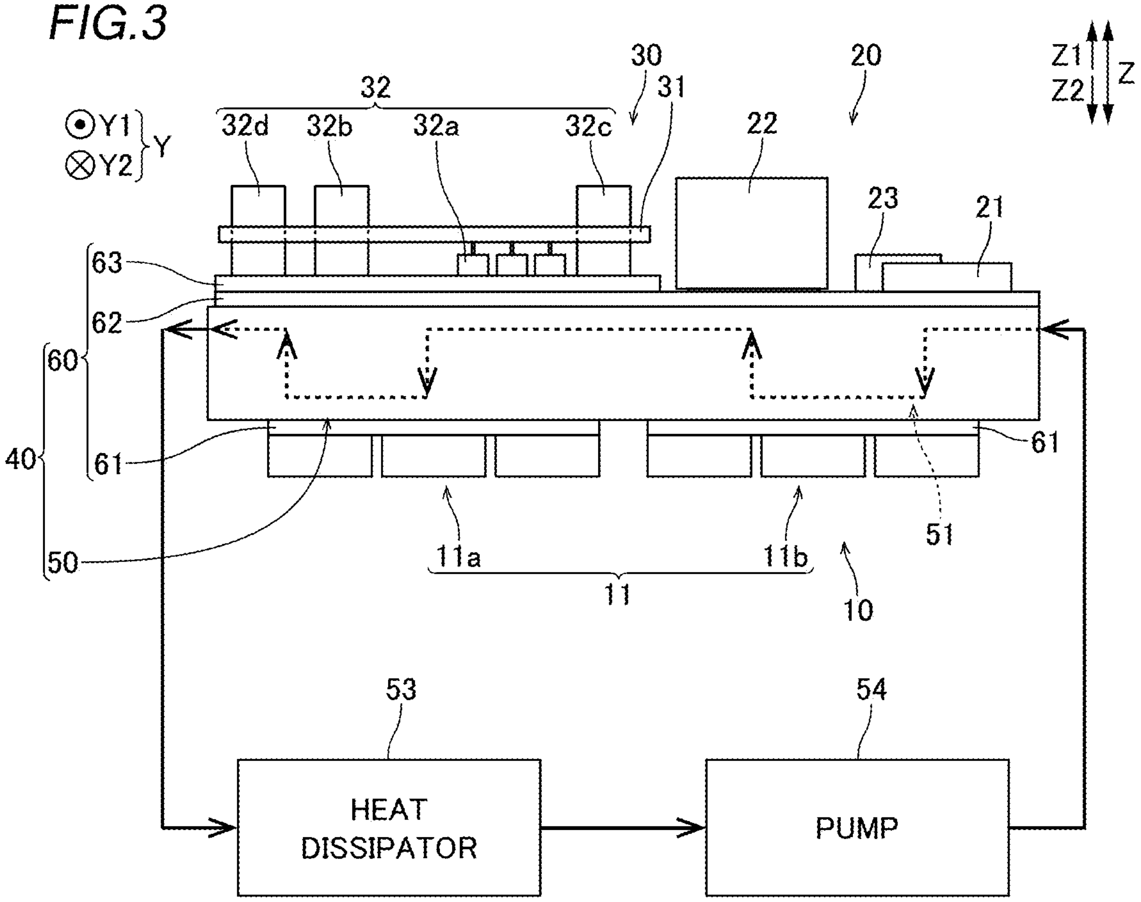
FIG. 3 is a side view of the power conversion apparatus according to the one embodiment of the present invention.

As shown in FIG. 3, the lid 60 includes an inverter lid 61, a boost-converter lid 62, and a direct-current/direct-current-converter lid 63. The inverter lid 61 is arranged on the back surface side (Z2 side) of the cooler main part 50 so as to include a placement area of the inverter 10. The boost-converter lid 62 is arranged on the front surface side (Z1 side) of the cooler main part 50, including the placement area A1 (see FIG. 4) for the boost converter 20. The direct-current/direct-current-converter lid 63 is arranged on the front surface side (Z1 side) of the cooler main part 50 so as to include a placement area A2 (see FIG. 4) for the direct current/direct current converter 30. The inverter 10 arranged on the inverter lid 61, the boost converter 20 arranged on the boost-converter lid 62, and the direct current/direct current converter 30 arranged on the direct-current/direct-current-converter lid 63 are cooled by the cooling liquid flowing through the cooling flow path 51.

Figure 4:
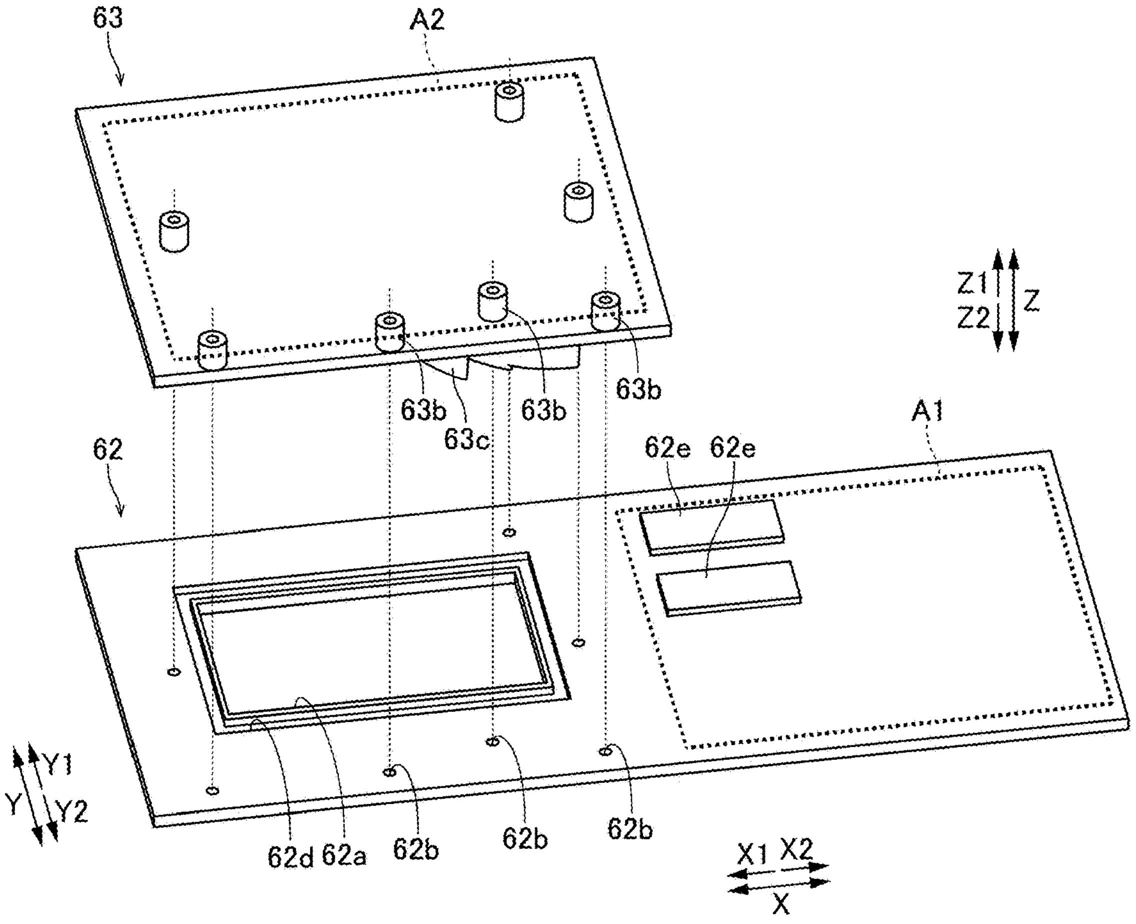
FIG. 4 is a perspective view showing a boot inverter lid and a direct-current/direct-current-converter lid according to the one embodiment of the present invention.

The direct-current/direct-current-converter lid 63 is arranged on the direct current/direct current converter 30 side (Z1 side) with respect to the boost-converter lid 62 so as to exclude the placement area A1 (see FIG. 4) for the boost converter 20 and to overlap the boost-converter lid 62. Specifically, as shown in FIG. 4, the boost-converter lid 62 is arranged on the entire front surface side (Z1 side) of the cooler main part 50 so as to include the placement area A1 for the boost converter 20 and to overlap at least part of the placement area A2 for the direct current/direct current converter 30 as viewed in the Z direction. The direct-current/direct-current-converter lid 63 is arranged only in an X1-side part on the front surface side (Z1 side) of the cooler main part 50 so as to include the placement area A2 for the direct current/direct current converter 30 and to exclude the placement area A1 for the boost converter 20. Also, the direct-current/direct-current-converter lid 63, and an X1-side part of the boost-converter lid 62 are arranged in this order in the Z direction from the Z1 side to the Z2 side.

Figure 5:
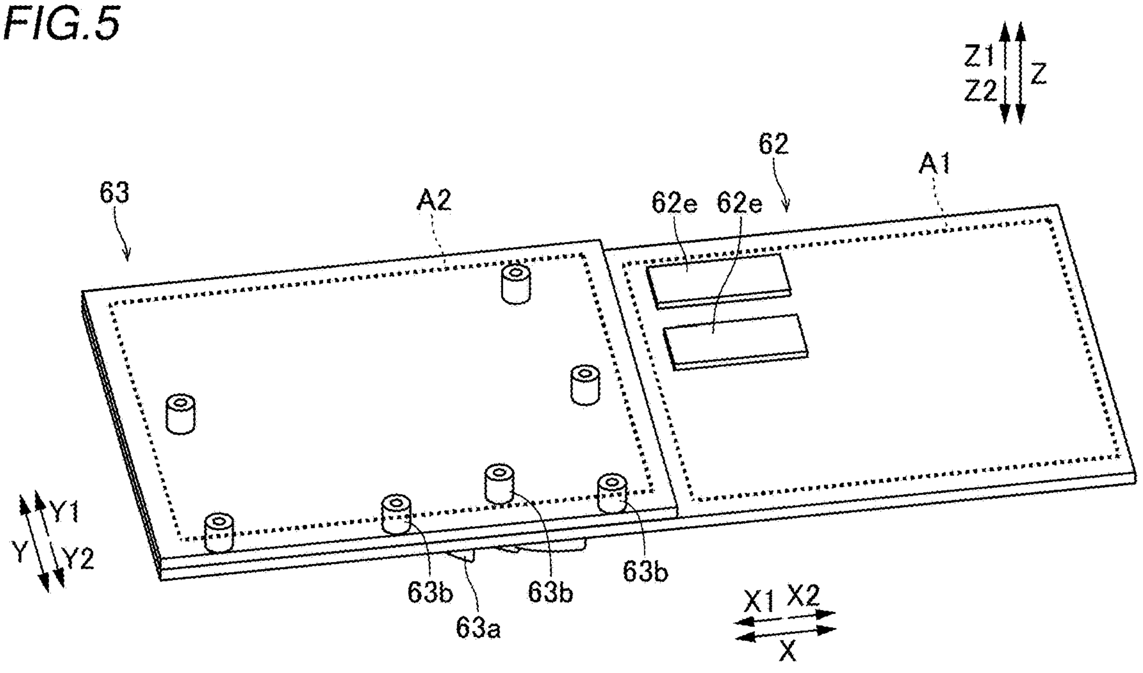
FIG. 5 is a perspective view showing the boot inverter lid and the direct-current/direct-current-converter lid according to the one embodiment of the present invention in an overlapping state.

The boost-converter lid 62 has a through opening 62*a* formed at a position corresponding to the direct-current/direct-current-converter lid 63. The direct-current/direct-current-converter lid 63 is arranged in a part on the direct current/direct current converter 30 side (Z1 side) with respect to the boost-converter lid 62 so that the through opening 62*a* is closed by the direct-current/direct-current-converter lid 63. As shown in FIG. 5, the direct-current/direct-current-converter lid 63 and the boost-converter lid 62 are fixed by fastening fastening parts 63*b* of the direct-current/direct-current-converter lid 63 and the fastening parts 62*b* of the direct-current/direct-current-converter lid 62 to each other by using fasteners (not shown) with the through opening 62*a* of the boost-converter lid 62 being closed by the direct-current/direct-current-converter lid 63.

Figure 6:
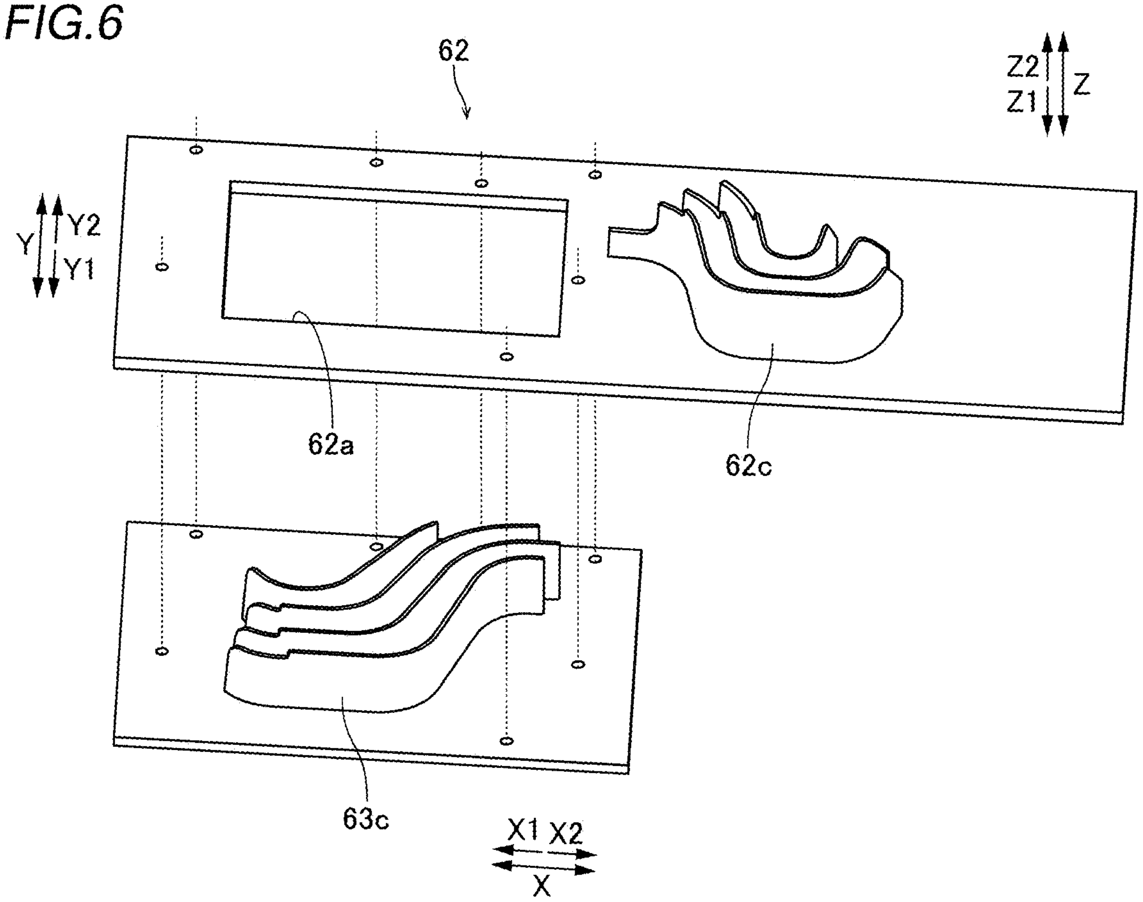
FIG. 6 is a perspective view showing the boot inverter lid and the direct-current/direct-current-converter lid according to the one embodiment of the present invention as viewed from a back surface side.
Figure 7:
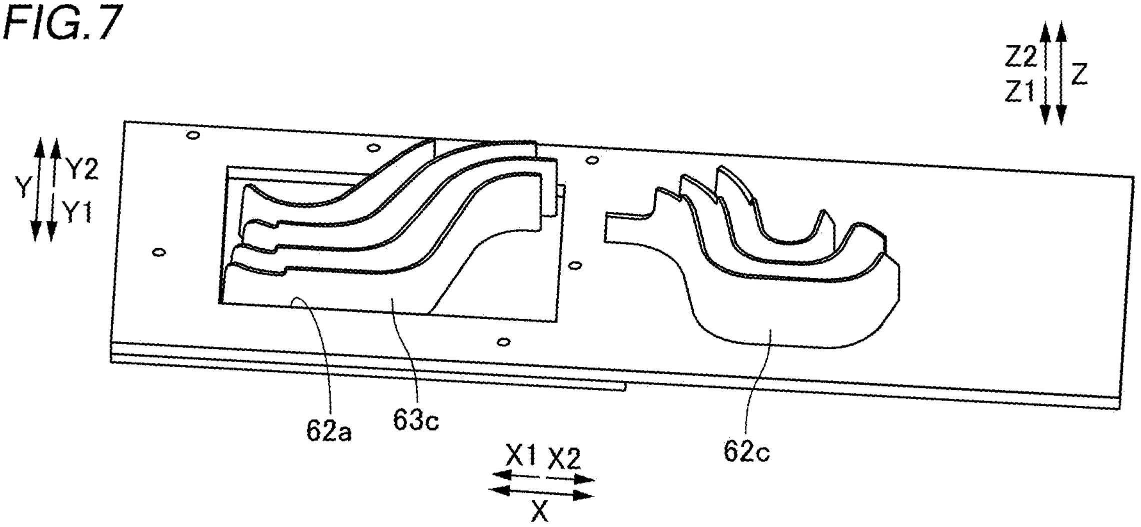
FIG. 7 is a perspective view showing the boot inverter lid and the direct-current/direct-current-converter lid according to the one embodiment of the present invention in the overlapping state as viewed from the back surface side.

As shown in FIG. 6, cooling fins 62*c* protruding into the cooling flow path 51 are formed at positions of a surface of the boost-converter lid 62 on the cooling flow path 51 side (Z2 side) corresponding to contact parts 62*e* (described later). In addition, as shown in FIGS. 6 and 7, cooling fins 63*c* are formed on a surface of the direct-current/direct-current-converter lid 63 on the cooling flow path 51 side (Z2 side) to pass the through opening 62*a* of the boost-converter lid 62 so as to protrude into the cooling flow path 51. The cooling fins 62*c* and the cooling fins 63*c* have curved shapes extending in a flow direction of the cooling liquid in the cooling flow path 51.

Figure 8:
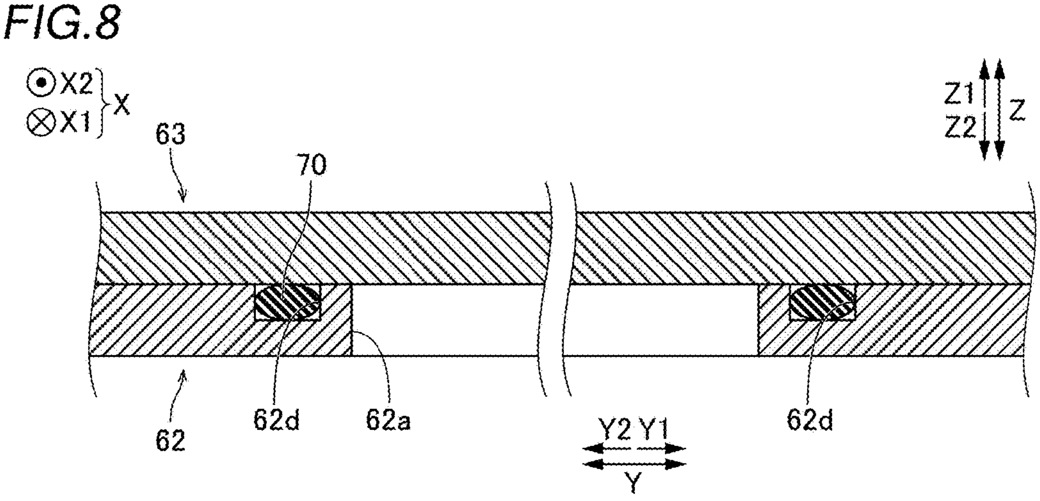
FIG. 8 is a cross-sectional view of a seal groove and a seal according to the one embodiment of the present invention taken along a YZ plane.

As shown in FIG. 4, a seal groove 62*d* is formed around the through opening 62*a* on the surface of the direct-current/direct-current-converter lid 63 side (Z1 side) of the boost-converter lid 62. In addition, as shown in FIG. 8, the power conversion apparatus 100 includes a seal 70 arranged in the seal groove 62*d* to seal between the boost-converter lid 62 and the direct-current/direct-current-converter lid 63. The seal 70 is a rubber O-ring, for example.

<Configuration of Reactor>

As shown in FIG. 2, the reactor 22 is arranged in a part of the placement area A1 (see FIG. 4) for the boost converter 20 on the X1 side and the Y1 side. The boost switching element module 21 is arranged in a part of the placement area A1 for the boost converter 20 on the X2 side and the Y2 side with respect to the reactor 22.

Figure 9:
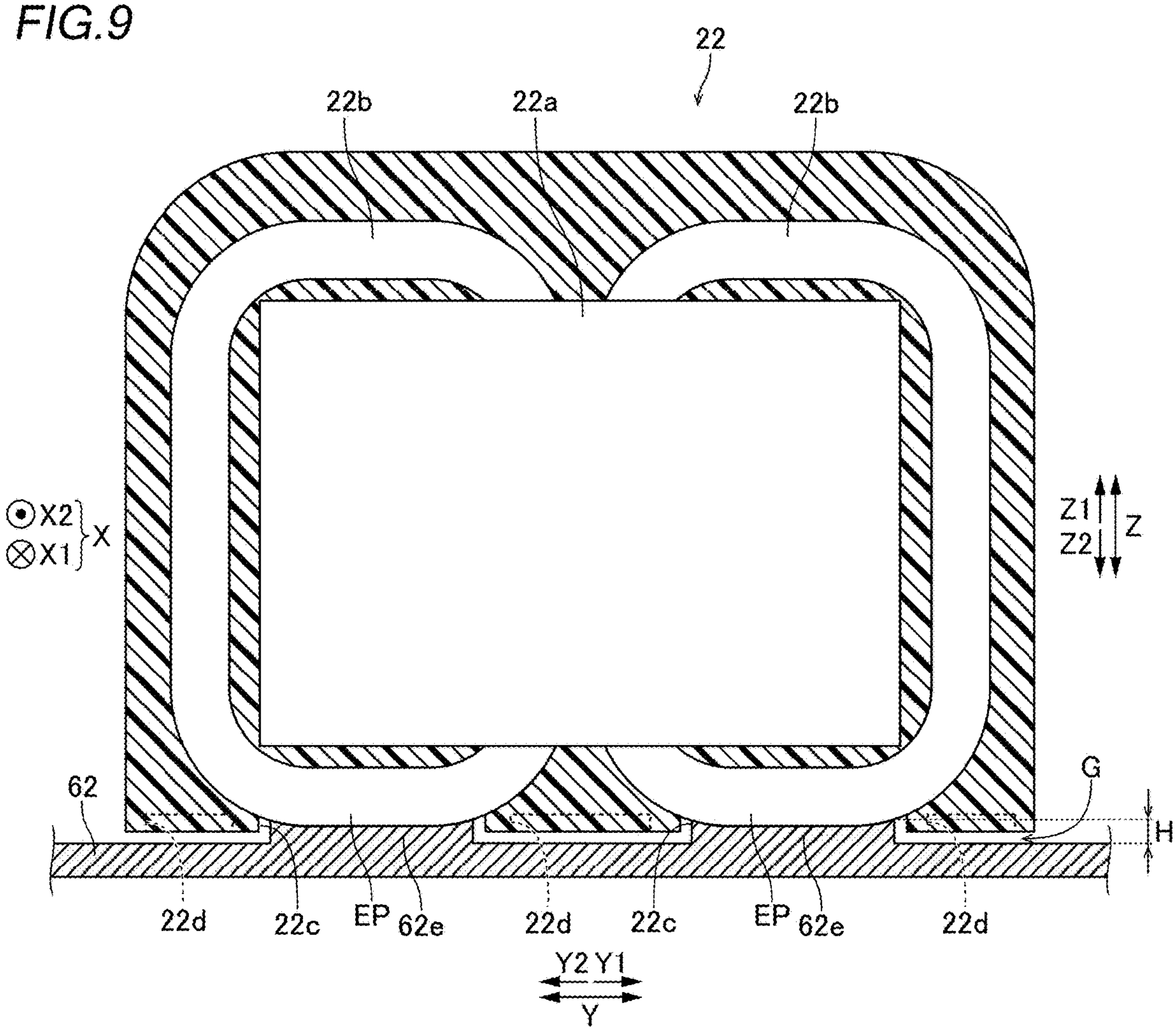
FIG. 9 is a cross-sectional view of contact parts between a reactor and the boost-converter lid according to the one embodiment of the present invention taken along the YZ plane.
Figure 10:
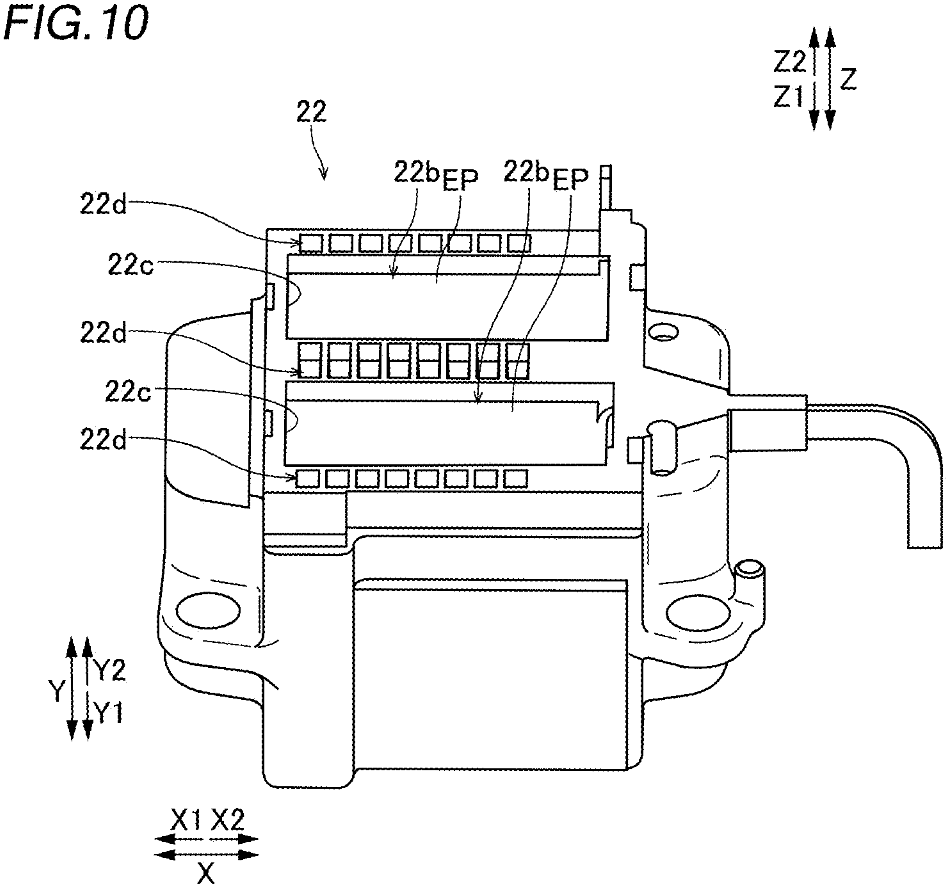
FIG. 10 is a perspective view showing the reactor according to the one embodiment of the present invention as viewed from the back surface side.

As shown in FIG. 9, the reactor 22 is formed of a resin to include coils 22*b* parts of which are exposed by resin molding. Specifically, the reactor 22 includes a core 22*a*, which has a toroidal shape as viewed in the Z direction, and two coils 22*b* wound on the core 22*a*. Each of the two coils 22B has a toroidal shape as viewed in the X direction. The reactor 22 is formed to expose Z2-side end parts of the two coils 22*b*, which have the toroidal shape as viewed in the X direction, by resin molding. As shown in FIG. 10, openings 22*c* are formed in a Z2-side surface of the reactor 22, which is formed by resin molding, to expose the Z2-side end parts of the two coils 22*b*.

As shown in FIG. 9, the reactor 22 is arranged to bring the exposed coil parts EP, which are exposed from the resin, of the coils 22*b* in contact with the contact parts 62*e* of the boost-converter lid 62 to be in contact with the reactor 22. The contact parts 62*e* are formed to protrude from the boost-converter lid 62 toward the exposed coil part EP side (Z1 side).

The exposed coil parts EP are the Z2-side end part of the coils 22*b*, which has the toroidal shape as viewed in the X direction, and correspondingly have a convex shape that protrudes toward the boost-converter lid 62 side (Z2 side). To address this, the contact parts 62*e* have a concave shape that is arranged at a position corresponding to the convex shape of each exposed coil part EP, and recessed toward the boost-converter lid 62 side. Specifically, the Z1-side ends of the contact parts 62*e*, which protrude from the boost-converter lid 62 toward the Z1 side have the concave shape recessed toward the Z2 side.

The contact parts 62*e* have a protrusion height H that forms a gap G between a part of a surface of the reactor 22 on the exposed coil part EP side (Z2 side) other than the exposed coil parts EP and the boost-converter lid 62 with the contact parts 62*e* being in contact with the exposed coil parts EP. The reactor 22 is fixed to the boost-converter lid 62 by fasteners (not shown) with the contact parts 62*e* being in contact with the exposed coil parts EP, and without the part of the surface of the reactor on the exposed coil part EP side other than the exposed coil parts EP being in contact with the boost-converter lid 62.

As shown in FIG. 10, the exposed coil parts EP have a rectangular shape as viewed in a direction (Z direction) in which the reactor 22 and the boost-converter lid 62 are aligned. Specifically, two exposed coil parts EP have an elongated rectangular shape as viewed in the Z direction, are aligned in an extension direction (Y direction) of a shorter side of the elongated rectangular shape.

As shown in FIG. 4, the contact parts 62*e* have a rectangular shape that overlaps each exposed coil part EP as viewed in the direction (Z direction) in which the reactor and the boost-converter lid 62 are aligned. Specifically, two contact parts 62*e* have an elongated rectangular shape that overlaps corresponding one of the two exposed coil parts EP as viewed in the Z direction, and are aligned with each other in the extension direction (Y direction) of the shorter side of the elongated rectangular shape.

As shown in FIG. 10, a plurality of holes 22*d* is formed in parts adjacent to the exposed coil parts EP in the Y direction. The plurality of holes 22*d* is provided to reduce a weight of the reactor 22, which is formed by resin molding, and to reduce thicker parts (of the resin) when the reactor 22 is formed by resin molding. Reduction of thicker parts in resin molding of the reactor 22 can prevent appearance of sinks (depressions appear due to shrinkage in molding).

<Configuration of Direct Current/Direct Current or DC/DC Converter>

As shown in FIG. 2, the direct current/direct current converter 30 includes a direct current/direct current converter board 31, and a direct current/direct current converter element 32 mounted on the direct current/direct current converter board 31. The direct current/direct current converter board 31 has a flat plate shape. The direct current/direct current converter elements 32 includes a converter switching element 32*a*, a transformer 32*b*, a resonant reactor 32*c*, and a smoothing reactor 32*d*. The converter switching element 32*a* is installed on a part on the back side (Z2 side) with respect to the direct current/direct current converter board 31. The converter switching element 32*a* is an example of a "semiconductor switching element" in the claims.

Figure 11:
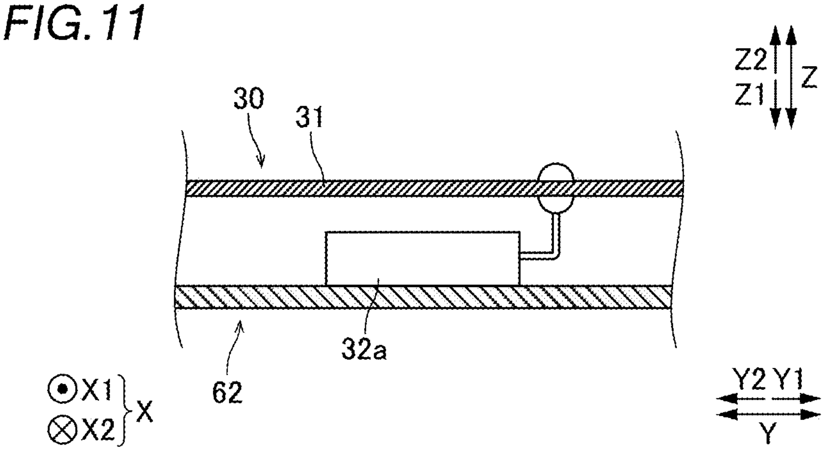
FIG. 11 is a cross-sectional view of a converter switching element according to the one embodiment of the present invention taken along the YZ plane.

As shown in FIG. 11, the converter switching element 32*a* is connected to a wiring line of the direct current/direct current converter board 31 by solder. The converter switching element 32*a* is bonded onto the Z1-side surface of the direct-current/direct-current-converter lid 63 by an insulating adhesive. That is, the direct current/direct current converter 30 includes the converter switching element 32*a* bonded onto the direct-current/direct-current-converter lid 63.

Advantages of the Embodiment

In this embodiment, the following advantages are obtained.

In this embodiment, as described above, the lid 60 includes a boost-converter lid 62 arranged to include a placement area A1 for the boost converter 20, and a direct-current/direct-current-converter lid 63 arranged on the direct current/direct current converter 30 side with respect to the boost-converter lid 62 to include a placement area A2 for the direct current/direct current converter 30, to exclude the placement area A1 for the boost converter 20, and to overlap the boost-converter lid 62. Accordingly, because the direct-current/direct-current-converter lid 63, which includes the placement area A2 for the direct current/direct current converter 30 and does not include the placement area A1 for the boost converter 20, is arranged on the direct current/direct current converter 30 side with respect to the boost-converter lid 62, it is possible to integrally remove, from the cooler main part 50, the direct current/direct current converter 30 and the direct-current/direct-current-converter lid 63 on which direct current/direct current converter 30 is arranged with the boost converter 20 being arranged on the boost-converter lid 62. Consequently, integral removal of the direct current/direct current converter and the lid from the cooler main part is allowed without removal of the boost converter from the lid.

In this embodiment, as described above, the boost-converter lid 62 has a through opening 62*a* formed at a position corresponding to the direct-current/direct-current-converter lid 63. In addition, the direct-current/direct-current-converter lid 63 is arranged in a part on the direct current/direct current converter 30 side with respect to the boost-converter lid 62 so that the through opening 62*a* is closed by the direct-current/direct-current-converter lid 63. Accordingly, because a thickness of the lid 60 in a part that closes the through opening 62*a* by using the direct-current/direct-current-converter lid 63 is defined by only a thickness of the direct-current/direct-current-converter lid 63, even in a configuration in which the direct-current/direct-current-converter lid 63 overlaps with the boost-converter lid 62, it is possible to suppress increase of a part of the lid 60 whose thickness is defined by thicknesses of the two lids, which are the direct-current/direct-current-converter lid 63 and the boost-converter lid 62. Consequently, it is possible to prevent reduction of heat dissipation from the lid 60 due to the overlapping of the direct-current/direct-current-converter lid 63 with the boost-converter lid 62.

In this embodiment, as described above, the power conversion apparatus 100 includes cooling fins 63*c* formed on a surface of the direct-current/direct-current-converter lid 63 on the cooling flow path 51 side to pass the through opening 62*a* of the boost-converter lid 62 so as to protrude into the cooling flow path 51. Accordingly, it is possible to efficiently cool the direct-current/direct-current-converter lid 63 by a cooling liquid flowing in the cooling flow path 51 through the cooling fin 63*c*. Consequently, it is possible to efficiently dissipate heat generated from the direct-current/direct-current-converter lid 63 to the cooling flow path 51 covered by the direct-current/direct-current-converter lid 63.

In this embodiment, as described above, the cooling fins 63*c* protruding into the cooling flow path 51 through the through opening 62*a* have curved shapes extending in a flow direction of a cooling liquid in the cooling flow path 51. Accordingly, because surface areas of the cooling fins 63*c* are increased by curved amounts of the cooling fins 63*c*, it is possible to more efficiently cool the direct-current/direct-current-converter lid 63 by the cooling liquid flowing in the cooling flow path 51 through the cooling fins 63*c*.

In this embodiment, as described above, the power conversion apparatus 100 includes a seal groove 62*d* formed around the through opening 62*a* on the surface of the direct-current/direct-current-converter lid 63 side of the boost-converter lid 62. In addition, the power conversion apparatus 100 includes a seal 70 arranged in the seal groove 62*d* to seal between the boost-converter lid 62 and the direct-current/direct-current-converter lid 63. Accordingly, even in the configuration in which the direct-current/direct-current-converter lid 63 is arranged on the direct-current/direct-current-converter lid 63 side with respect to the boost-converter lid 62 to close the through opening 62*a* by the direct-current/direct-current-converter lid 63, it is possible to easily seal between the boost-converter lid 62 and the direct-current/direct-current-converter lid 63 by using the seal 70.

In this embodiment, as described above, the direct current/direct current converter 30 includes the converter switching element 32*a* (semiconductor switching element) bonded onto the direct-current/direct-current-converter lid 63. Here, when the converter switching element 32*a* is replaced, it is necessary to integrally remove the direct current/direct current converter 30 including the converter switching element 32*a* together with the direct-current/direct-current-converter lid 63 to which the converter switching element 32*a* is bonded from the cooler main part 50. For this reason, in a case in which the direct current/direct current converter 30 is configured to include the converter switching element 32*a* bonded onto the direct-current/direct-current-converter lid 63, a configuration that allows integral removal of the direct current/direct current converter 30 and the lid 60 from the cooler main part 50 without removal of the boost converter 20 from the lid 60 is effective.

Modified Embodiments

Note that the embodiment disclosed this time must be considered as illustrative in all points and not restrictive. The scope of the present invention is not shown by the above description of the embodiments but by the scope of claims for patent, and all modifications (modified embodiments) within the meaning and scope equivalent to the scope of claims for patent are further included.

While the example in which the direct current/direct current converter 30 includes the converter switching element 32*a* (semiconductor switching element) bonded onto the direct-current/direct-current-converter lid 63 has been shown in the aforementioned embodiment, the present invention is not limited to this. In the present invention, alternatively, the direct current/direct current converter can include no semiconductor switching element bonded onto the direct-current/direct-current-converter lid.

While the example in which the seal groove 62*d* is formed around the through opening 62*a* on the surface of the direct-current/direct-current-converter lid 63 side of the boost-converter lid 62, and the power conversion apparatus 100 includes the seal 70 arranged in the seal groove 62*d* to seal between the boost-converter lid 62 and the direct-current/direct-current-converter lid 63 has been shown in the aforementioned embodiment, the present invention is not limited to this. In the present invention, alternatively, no seal groove can be formed around the through opening on the surface of the direct-current/direct-current-converter lid side of the boost-converter lid, and the power conversion apparatus 100 includes no seal arranged in the seal groove to seal between the boost-converter lid and the direct-current/direct-current-converter lid.

While the example in which the cooling fins 63*c* protruding into the cooling flow path 51 through the through opening 62*a* have curved shapes extending in a flow direction of the cooling liquid in the cooling flow path 51 has been shown in the aforementioned embodiment, the present invention is not limited to this. In the present invention, alternatively, the cooling fins protruding into the cooling flow path through the through opening can be formed not in a curved shape extending in a flow direction of the cooling liquid in the cooling flow path.

While the example in which the cooling fins 63*c* are formed on a surface of the direct-current/direct-current-converter lid 63 on the cooling flow path 51 side to pass the through opening 62*a* of the boost-converter lid 62 so as to protrude into the cooling flow path 51 has been shown in the aforementioned embodiment, the present invention is not limited to this. In the present invention, alternatively, no cooling fin can be formed on the surface of the direct-current/direct-current-converter lid on the cooling flow path side.

While the example in which the boost-converter lid 62 has the through opening 62*a* formed at a position corresponding to the direct-current/direct-current-converter lid 63, and the direct-current/direct-current-converter lid 63 is arranged in a part on the direct current/direct current converter 30 side with respect to the boost-converter lid 62 so that the through opening 62*a* is closed by the direct-current/direct-current-converter lid 63 has been shown in the aforementioned embodiment, the present invention is not limited to this. In the present invention, alternatively, the boost-converter lid can include no through opening formed at a position corresponding to the direct-current/direct-current-converter lid, and the direct-current/direct-current-converter lid is not necessarily arranged on the direct current/direct current converter side with respect to the boost-converter lid to close the through opening by the

What is claimed is:

1. A power conversion apparatus comprising:
- a boost converter for boosting direct current power input from a direct current power supply;
- an inverter for converting the direct current power boosted by the boost converter into alternate current power and supplying the alternate current power to a load;
- a direct current/direct current converter for transforming the direct current power input from the direct current power supply; and
- a base on which the boost converter, the inverter, and the direct current/direct current converter are arranged, wherein
- the base includes
  - a cooler main part including a cooling flow path formed in the cooler main part, and formed of a metal, and
  - a lid arranged to cover the cooling flow path of the cooler main part, and formed of a metal, and
- the lid includes
  - a boost-converter lid arranged to include a placement area for the boost converter, and
  - a direct-current/direct-current-converter lid arranged on the direct current/direct current converter side with respect to the boost-converter lid to include a placement area for the direct current/direct current converter, to exclude the placement area for the boost converter, and to overlap the boost-converter lid.

2. The power conversion apparatus according to claim 1, wherein
- the boost-converter lid includes a through opening formed at a position corresponding to the direct-current/direct-current-converter lid; and
- the direct-current/direct-current-converter lid is arranged on the direct current/direct current converter side with respect to the boost-converter lid to close the through opening by the direct-current/direct-current-converter lid.

3. The power conversion apparatus according to claim 2, further comprising a cooling fin formed on a surface of the direct-current/direct-current-converter lid on the cooling flow path side to pass the through opening of the boost-converter lid so as to protrude into the cooling flow path.

4. The power conversion apparatus according to claim 3, wherein the cooling fin protruding into the cooling flow path through the through opening has a curved shape extending in a flow direction of a cooling liquid in the cooling flow path.

5. The power conversion apparatus according to claim 2, further comprising:
- a seal groove formed around the through opening on a surface of the direct-current/direct-current-converter lid side of the boost-converter lid; and
- a seal arranged in the seal groove to seal between the boost-converter lid and the direct-current/direct-current-converter lid.

6. The power conversion apparatus according to claim 1, wherein the direct current/direct current converter includes a semiconductor switching element bonded onto the direct-current/direct-current-converter lid.

* * * * *